United States Patent
Hasegawa (10) Patent No.: US 7,782,144 B2
(45) Date of Patent: Aug. 24, 2010

(54) ACTIVE FILTER IN PLL CIRCUIT (75) Inventor: Katashi Hasegawa, Kasugai (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 11/318,608

(22) Filed: Dec. 28, 2005

(65) Prior Publication Data

US 2007/0075788 A1 Apr. 5, 2007

(30) Foreign Application Priority Data

Sep. 30, 2005 (JP) ............................. 2005-289043

(51) Int. Cl.
*H03L 7/093* (2006.01)
(52) U.S. Cl. ...................... 331/17; 331/11; 327/157
(58) Field of Classification Search .............. 331/11, 331/17; 327/157
See application file for complete search history.

(56) References Cited

U.S. PATENT DOCUMENTS

| 6,040,742 | A * | 3/2000 | Bailey et al. ................ 327/157 |
| 6,611,160 | B1 * | 8/2003 | Lee et al. .................... 327/157 |
| 6,963,232 | B2 * | 11/2005 | Frans et al. ................ 327/156 |
| 7,015,735 | B2 | 3/2006 | Kimura et al. |
| 2005/0280453 | A1 * | 12/2005 | Hsieh ........................ 327/156 |
| 2006/0145770 | A1 * | 7/2006 | Manetakis et al. ........... 331/16 |

FOREIGN PATENT DOCUMENTS

| JP | 03-136522 A | 6/1991 |
| JP | 07-079159 A | 3/1995 |
| JP | 09-130241 A | 5/1997 |
| JP | 11-68560 A | 3/1999 |
| JP | 2919321 A | 7/1999 |
| JP | 2005-094427 A | 4/2005 |
| JP | 2005-167536 A | 6/2005 |
| JP | 2005-184771 A | 7/2005 |
| JP | 2005-520455 A | 7/2005 |
| WO | WO 03/098807 A1 | 11/2003 |

OTHER PUBLICATIONS

Official Communication (Notice of Rejection Ground) dated Feb. 24, 2009 with English Translation.

* cited by examiner

*Primary Examiner*—Robert Pascal
*Assistant Examiner*—James E Goodley
(74) *Attorney, Agent, or Firm*—Arent Fox LLP (57) ABSTRACT

A low pass filter can be built in a chip by reducing the value of circuit element forming a low pass filter in a PLL circuit, especially by reducing the value of a electrostatic capacity. An active filter used in a PLL circuit having two charge pump circuits in a subsequent stage of a phase comparator includes a first circuit component connected between the output of one charge pump circuit and a ground, a second circuit component between the output of another charge pump circuit and the ground, and a voltage adder for adding up voltages between both ends of each of the first and second circuit components.

4 Claims, 10 Drawing Sheets

| | PRIOR ART | PRESENT INVENTION | | UNIT |
|---|---|---|---|---|
| | PCS | PCS | GPS | |
| VCO OUTPUT FREQUENCY | 2140 | 2140 | 2140 | 1391.8 | MHz |
| PHASE COMPARISON FREQUENCY | 19800 | 19800 | 19800 | 19800 | kHz |
| OPEN LOOP BAND WIDTH | 7.8 | 7.8 | 7.8 | 7.8 | kHz |
| CHARGE PUMP | 0.075 | 0.046 | 0.046 | 0.03 | mA/2$\pi$ |
| VCO GAIN | 15 | 15 | 15 | 15 | MHz/V |
| PHASE MARGIN | 45 | 45 | 45 | 45 | degree |
| ATT | 10 | 10 | 10 | 10 | dB |
| R3/R2 | 2 | 2 | 2 | 2 | - |
| $\alpha$ | - | 0.1 | 0.01 | 0.1 | - |
| N | 108.08 | 108.08 | 108.08 | 70.29 | - |
| $\omega c$ | 48930.411 | 48998.826 | 48998.826 | 48998.826 | radian |
| C1 | 1.80E-09 | 6.42E-10 | 6.42E-11 | 6.44E-10 | F |
| R2 | 5.67E+03 | 6.36E+03 | 6.36E+03 | 6.34E+03 | $\Omega$ |
| C2 | 8.70E-09 | 1.33E-09 | 1.33E-09 | 1.33E-09 | F |
| R3/R2 | 1.13E+04 | 1.27E+04 | 1.27E+04 | 1.27E+04 | $\Omega$ |
| C3 | 1.04E-12 | 9.29E-13 | 9.29E-13 | 9.32E-13 | F |
| C1+C3 | 1.80E-09 | 6.43E-10 | 6.52E-11 | 6.45E-10 | F |
| TOTAL CAPACITY | 1.05E-08 | 1.97E-09 | 1.39E-09 | 1.98E-09 | F |

FIG. 9

| CALCULATED VALUE | DUAL CHARGE PUMP LOW PASS FILTER | | UNIT |
| --- | --- | --- | --- |
| | PCS | | |
| VCO OUTPUT FREQUENCY | 2140 | 2140 | MHz |
| PHASE COMPARISON FREQUENCY | 19800 | 19800 | kHz |
| OPEN LOOP BAND WIDTH | 7.8 | 8.7 | kHz |
| CHARGE PUMP | 0.046 | 0.046 | $mA/2\pi$ |
| VCO GAIN | 15 | 15 | MHz/V |
| PHASE MARGIN | 45 | 38 | degree |
| ATT | 10 | 10 | dB |
| R3/R2 | 2 | 2 | - |
| $\alpha$ | 0.01 | 0.015 | - |
| N | 108 | 108 | - |
| $\omega c$ | 48999 | 54381 | radian |
| C1 | 6.422E-11 | 6.422E-11 | F |
| R2 | 6359.4 | 6359.4 | $\Omega$ |
| C2 | 1.327E-09 | 1.327E-09 | F |
| R3/R2 | 1.272E+04 | 1.272E+04 | $\Omega$ |
| C3 | 9.293E-13 | 9.293E-13 | F |
| C1+C3 | 6.515E-11 | 6.515E-11 | F |
| TOTAL CAPACITY | 1.392E-09 | 1.392E-09 | F |

FIG. 10

ACTIVE FILTER IN PLL CIRCUIT

CROSS-REFERENCE TO RELATED APPLICATIONS

This application is based upon and claims the benefit of priority from the prior Japanese Patent Application No. 2005-289043, filed in Sep. 30, 2005, the entire contents of which are incorporated herein by reference.

BACKGROUND OF THE INVENTION

1. Field of the Invention

The present invention relates to a low pass filter as a loop filter for use in a PLL (phase locked loop) circuit, and more specifically to an active filter capable of realizing a downsized chip loaded with a PLL circuit by reducing the value of an electrostatic capacity forming a low pass filter, and making fine adjustments of the characteristic as a filter.

2. Description of the Related Art

A PLL (phase locked loop, phase synchronous loop) circuit is widely used for various consumer equipment such as a synchronous signal generation circuit of a television receiver, a stereo demodulation circuit of an FM broadcast, etc., a satellite communication equipment, a measure, etc. for business use in order to detect a synchronous signal and to demodulate a signal.

The present invention relates to a low pass filter for removing the high frequency component in an input voltage of a voltage control oscillator corresponding to the current from the charge pump circuit depending on the detection result of the phase difference between the reference signal and the output signal of the voltage control oscillator, detected by a phase comparator in a PLL circuit.

Recently, as a communication terminal equipment unit such as a mobile telephone, etc. becomes smaller, there has been a strong demand for a smaller module loaded with a PLL circuit. To realize a smaller module, it is necessary to include a PLL circuit in a chip, but it is difficult to downsize a low pass filter for use in a PLL circuit. When a conventional passive filter is used as the above-mentioned filter, an electrostatic capacity or resistance having relatively a large value is required, and when a conventional passive filter is contained in a chip as is, the area of the chip increases.

Figure 1:
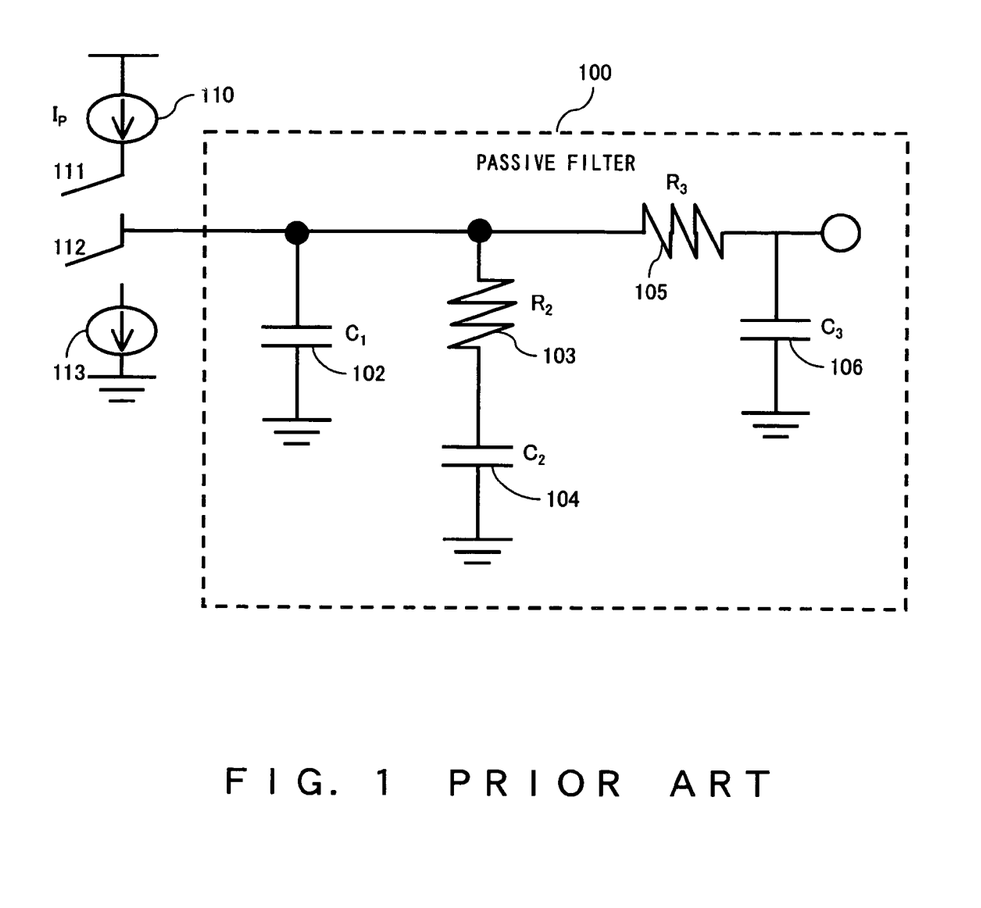
FIG. 1 shows the configuration of a conventional technology of a low pass filter of a PLL circuit.

FIG. 1 shows an example of a configuration of a conventional passive filter. In response to the input from the charge pump circuit, a passive filter 100 has an electrostatic capacity $C_1$ 102, and a series circuit of a resistance $R_2$ 103 and an electrostatic capacity $C_2$ 104 connected in parallel, and the capacity $C_1$ and the series circuit are then grounded. It also includes resistance $R_3$ 105 between the input from a charging pump and an output terminal of the passive filter 100, and an electrostatic capacity $C_3$ 106 connected between an output terminal of the passive filter 100 and a ground.

To the passive filter 100, a charge pump circuit formed by a current source 110, two switches 111 and 112, and a current source 113 is connected. The charge pump circuit controls the input voltage for the voltage control oscillator at the subsequent stage of the passive filter 100 in the PLL circuit, depending on the phase difference between the reference signal and the output signal of the voltage control oscillator, detected by the phase comparator at the preceding stage in the PLL circuit. That is, the charge pump circuit passes the charging current to the passive filter by the current source 110 and the switch 111 (charge) when, for example, the phase of the reference signal is leading, When the phase of the reference signal is lagging behind, the discharging current from the passive filter is drawn (pumped) by the switch 112 and the current source 113.

The passive filter shown in FIG. 1 is a third-order filter, and an appropriate filter for a PLL circuit. However, when the passive filter 100 is contained as is in a chip, the area of the electrostatic capacity specifically increases and causes a difficult layout of the chip. Furthermore, in the passive filter 100, the value of each circuit component is optimized for a single application, the characteristic of the filter cannot be adjusted, and, for example, it is hardly used for another application having a different frequency.

The patent document 1 as the conventional technology relating to the above-mentioned PLL circuit discloses a charge pump circuit capable of holding the linearity of the output current for a phase error signal output from a phase comparator, and reducing a reference leak without requiring no special circuit for connection to the phase comparator.

The patent document 2 discloses a PLL synthesizer capable of reducing the rush current at the activation of the PLL synthesizer by providing the VCO (voltage control oscillator) of the PLL with an average voltage with the PLL locked for the period in which the operation becomes stable after power supply, thereby realizing low power consumption.

However, with the above-mentioned conventional technologies, a conventional passive low pass filter has a large value of electrostatic capacity, it is difficult to include a low pass filter in a chip, and the conventional passive filter can only be used for a single application.

[Patent Document 1] Japanese Patent Application Publication No. Hei 11-68560 "PLL Frequency Synthesizer and Charge Pump Circuit"

[Patent Document 2] Japanese Patent Publication No. 2919321 "PLL Synthesizer"

SUMMARY OF THE INVENTION

The present invention has been developed to solve the above-mentioned problems, and aims at including a low pass filter in a chip by reducing the value of circuit element forming a low pass filter in a PLL circuit, specifically the value of an electrostatic capacity, and making fine adjustments of the characteristic of a filter without changing the value of a circuit element.

The active filter according to the present invention receives output from two charge pump circuits, and includes a first circuit component connected between the output of one of the two charge pump circuits and a ground, a second circuit component connected between the output of another charge pump circuit and the ground, and a voltage adder for adding up the voltage between both ends of the first circuit component and the voltage between both ends of the second circuit component.

BEST MODE FOR CARRYING OUT THE INVENTION

Figure 2:
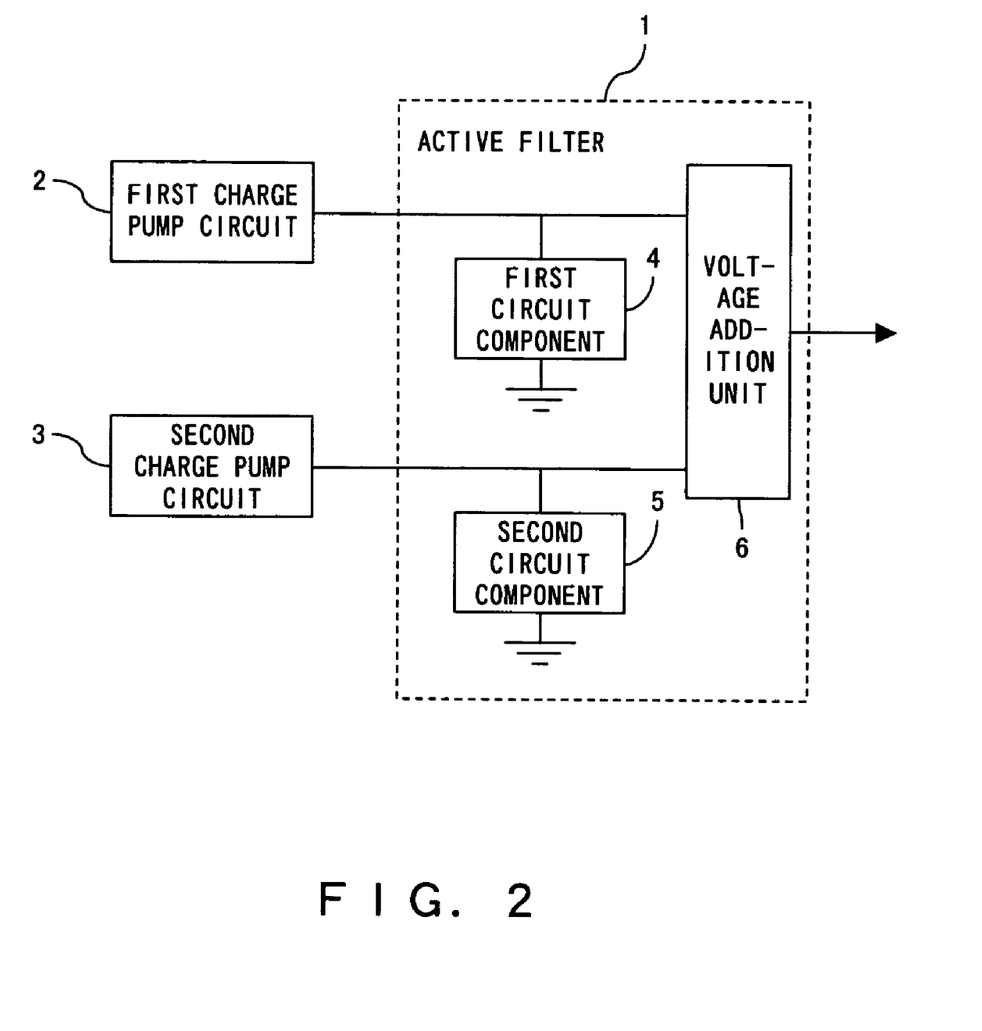
FIG. 2 is a view of the configuration showing the principle of the active filter according to the present invention.

FIG. 2 is a block diagram of the configuration showing the principle of the active filter according to the present invention. FIG. 2 is a block diagram of the configuration showing the principle of an active filter 1 in a PLL circuit comprising two charge pump circuits 2 and 3 at the stage after a phase comparator.

The active filter 1 comprises a first circuit component 4 connected between the output of one of the two charge pump circuits 2 and 3, that is, the first charge pump circuit 2 and the ground, a second circuit component 5 connected between the output of the other charge pump circuit, that is, the second charge pump circuit 3, and the ground, and a voltage addition unit 6 for adding up the voltage between both ends of the first circuit component 4 and the voltage between both ends of the second circuit component 5.

The first circuit component 4 is a parallel circuit of, for example, an electrostatic capacity and resistance, and the second circuit component 5 is an electrostatic capacity.

In the present embodiment, three or more charge pump circuits are provided at the subsequent stage of the phase comparator, and two of the three charge pump circuits are used as the first and second charge pump circuits, thereby realizing an active filter capable of changing the ratio of the output currents between two charge pump circuits.

As described above, according to the present invention, an active filter having a voltage adder is used as a low pass filter (loop filter) in the PLL circuit. Furthermore, by providing three or more charge pump circuits and selecting two charge pump circuits, the ratio of the current output from the two charge pump circuits can be changed.

According to the present invention, using an active filter having a voltage adder as a low pass filter in a PLL circuit, the circuit component forming a filter can be downsized as compared with a conventional passive filter, especially the value of an electrostatic capacity can be reduced, thereby easily realizing a built-in filter in a chip.

Figure 3:
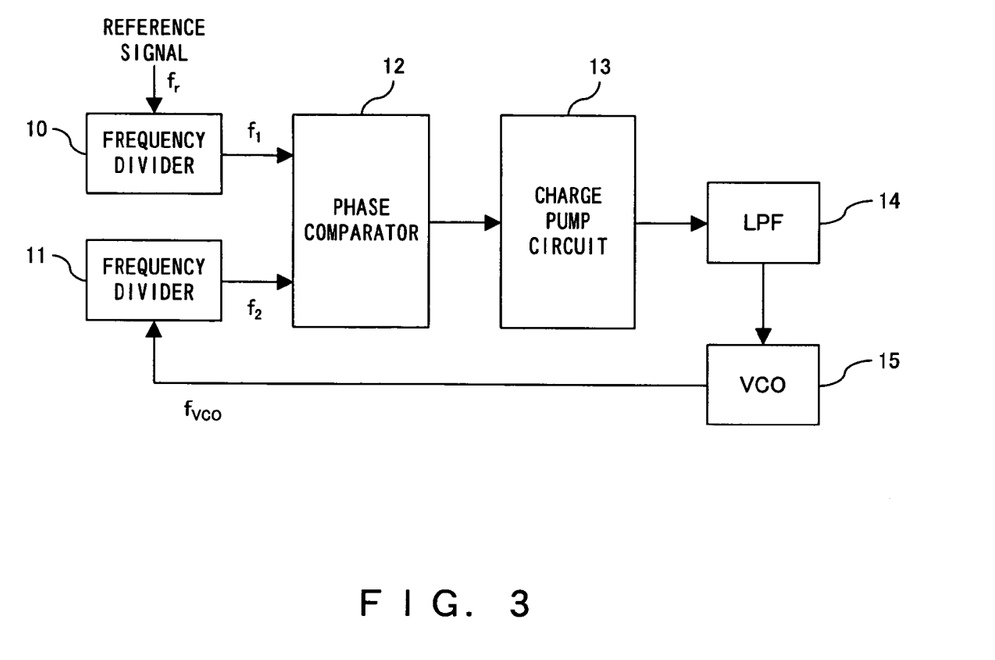
FIG. 3 shows the configuration of the entire PLL circuit.

FIG. 3 shows the configuration of the entire PLL circuit using the active filter according to the present invention. In FIG. 3, the PLL circuit comprises: a frequency divider 10 for receiving a reference signal; a frequency divider 11 for receiving output of a voltage control oscillator (VCO) 15 for generation of an output signal of the PLL circuit; a phase comparator 12 for receiving a signal of a frequency $f_1$ (hereinafter referred to as a signal $f_1$ for short) as the output of the frequency divider 10 and a signal $f_2$ as the output of the frequency divider 11, detecting the phase difference between signals $f_1$ and $f_2$; a charge pump circuit 13 basically for providing a charging current for a low pass filter (LPF) depending on the phase comparison result of the phase comparator 12; a low pass filter (loop filter) 14 for cutting off the high frequency component in the output of the charge pump circuit 13; a voltage control oscillator (VCO) 15 of which the oscillation frequency is controlled by the output of the LPF 14.

The active filter according to the present invention corresponds to the low pass filter (LPF) 14 shown in FIG. 3. The phase comparator 12 detects the phase difference between the two signals $f_1$ and $f_2$. For example, when the phase of the signal $f_1$ is leading the phase of the signal $f_2$, the charge pump circuit 13 is controlled to pass a charging current to the LPF 14. On the other hand, when the phase of the signal $f_1$ is lagging behind the phase of the signal $f_2$, the charge pump circuit 13 is controlled to pump the electric charge stored in the LPF 14, that is, to discharge it.

Figure 4:
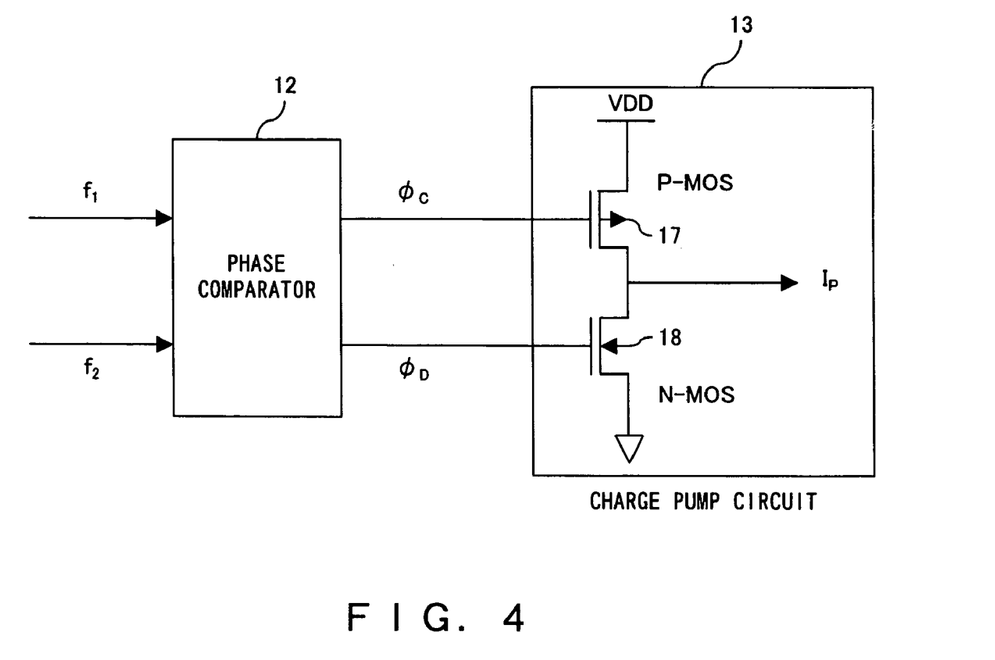
FIG. 4 shows an example of the configuration of the charge pump circuit.

FIG. 4 shows an example of the configuration of the charge pump circuit 13. In the present embodiment, two charge pump circuits are basically used. The configurations of the two charge pump circuits are similar to each other. For example, by changing the area of a MOS transistor, the charging current to the LPF 14 or the discharging current from the LPF 14 can be changed in the two charge pump circuits.

In FIG. 4, the phase comparator 12 outputs for a predetermined time the voltage "H" for turning on a P-type MOS transistor 17 as a signal $\phi c$ when, for example, the phase of the signal $f_1$ obtained after the frequency divider 10 divides the frequency of a reference signal is leading the phase of the signal $f_2$ obtained after the frequency divider 11 divides the frequency of the output signal of the VCO 15. As a result, the P-type MOS transistor 17 is turned on, and a charging current Ip is passed from the power supply voltage VDD to the LPF 14.

On the other hand, when the phase of the signal $f_1$ is lagging behind the phase of the signal $f_2$, the phase comparator 12 sets the signal $\phi D$ to "L" for a predetermined time to turn on an N-type transistor 18. As a result, the N-type transistor 18 is turned on, and the electric charge stored in the LPF 14 is passed as a discharging current from the LPF 14 to the ground through the N-type transistor 18.

Figure 5:
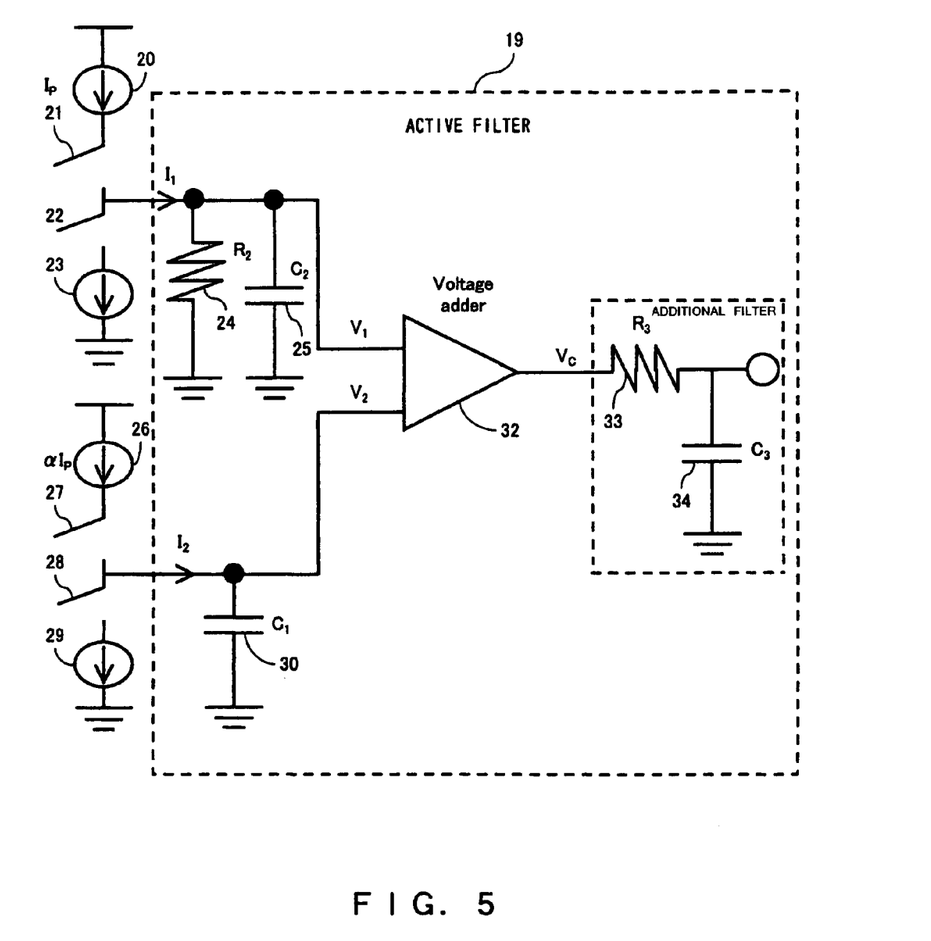
FIG. 5 shows the configuration of the active filter according to an embodiment of the present invention.

FIG. 5 shows an example of the configuration of the active filter according to the present embodiment. In FIG. 5, two charge pump circuits for passing a constant current to each of Ip and $\alpha$Ip as charging currents for an active filter 19 are connected to the active filter 19. With the configuration, a indicates a ratio between the current values of the two charge pump circuits. For example, the value of $\alpha$ is assumed to be smaller than "1".

The charge pump circuit for passing the charging current Ip is formed by a current source 20 and a switch 21 corresponding to the P-type MOS transistor 17 shown in FIG. 4, and a switch 22 and a current source 23 corresponding to the N-type transistor 18. The charge pump circuit for passing charging current $\alpha$Ip is similarly formed by a current source 26 and a switch 27 corresponding to the P-type MOS transistor 17, and a switch 28 and a current source 29 corresponding to the N-type transistor 18.

The active filter 19 comprises: a parallel connection of resistance $R_2$ 24 and an electrostatic capacity $C_2$ 25 connected between the output of the charge pump circuit for passing the charging current Ip and the ground; an electrostatic capacity $C_1$ 30 connected between the output of the charge pump circuit for passing the charging current $\alpha$Ip and the ground; a voltage adder 32; resistance $R_3$ 33 connected between the output of the voltage adder 32 and the output terminal of the active filter 19; and an electrostatic capacity $C_3$ 34 connected between the output terminal of the active filter 19 and the ground. The output of two charge pump circuits are connected as two pieces of input to the voltage adder 32.

When the active filter 19 shown in FIG. 5 is compared with the passive filter shown in FIG. 1 as a conventional technology, the configuration of the portion of the filter (additional filter) formed by the resistance $R_3$ 33 and the electrostatic capacity $C_3$ 34 as the subsequent stage of the voltage adder 32 are the same, but the configuration up to the voltage adder 32 is specific to the present embodiment. Thus, using the active filter 19 utilizing the output of the two charge pump circuits, the same characteristic as the passive filter of the conventional technology as explained by referring to FIG. 1 can be realized by an electrostatic capacity having a smaller value as described later.

It is also possible to adjust the characteristic of a filter using the same circuit constant by changing the value of α indicating the ratio of the values of charging currents in two charge pump circuits, to fit the filter for a different application, and to deal with a problem of the variance in process.

Figure 6:
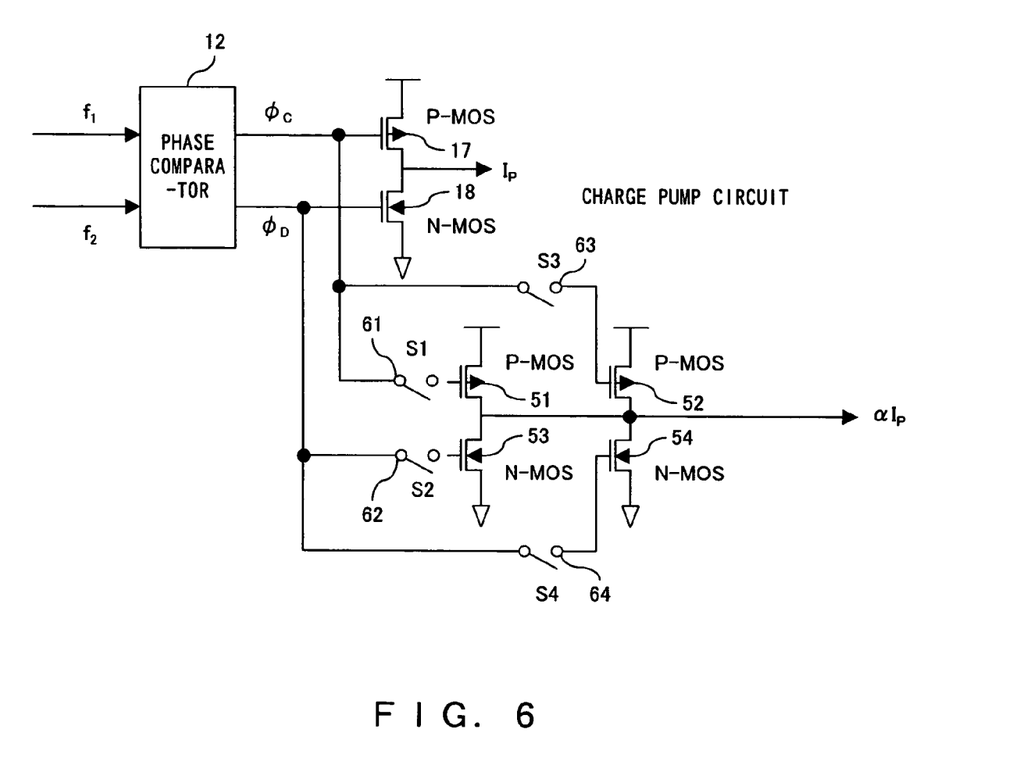
FIG. 6 is an explanatory view of the system of switching charge pump current values.

To change the value of the current ratio α, two or more charge pump circuits having different current values and, for example, comprising P-type MOS transistors 51 and 52, and N-type MOS transistors 53 and 54 are provided at the subsequent stage of the phase comparator 12 as shown in FIG. 6. The charge pump circuit for passing the current $I_2$ shown in FIG. 5 is to be changed to allow the control circuit formed by switches 61, 62, 63, and 64 to select one of the charge pump circuits.

To explain the reduction of the value of an electrostatic capacity and the adjustments of the characteristic of the filter, the transfer function of an active filter is calculated, and the possibility of changing the value of an electrostatic capacity $C_1$ by setting the current ratio α of the two charge pump circuits, is explained below.

First, assuming that, in FIG. 5, the current from the upper charge pump circuit is $I_1$ (=Ip), and the current from the lower charge pump circuit is $I_2$ (=αIp), the input voltages $V_1$ and $V_2$ are obtained, and a sum of them is obtained as the output voltage Vc of the voltage adder 32.

$$V_1 = \frac{R_2}{1+sC_2R_2} \cdot I_1$$

$$V_2 = \frac{1}{sC_1} \cdot I_2$$

$$V_C = V_1 + V_2 = \frac{\left[1 + \frac{R_2(C_1 I_1 + C_2 I_2)}{I_2} \cdot s\right] I_2}{sC_1(1+sC_2R_2)}$$

$I_2$=α$I_1$ is substituted for the equation above.

$$V_C = \frac{\alpha}{C_1} \cdot \frac{1 + \frac{R_2(C_1 + \alpha C_2)}{\alpha} \cdot s}{s(1+sC_2R_2)} \cdot I_1$$

The transfer function from $I_1$ to Vc is calculated as follows.

$$\frac{V_C}{I_1} = \frac{\alpha}{C_1} \cdot \frac{1 + \frac{R_2(C_1 + \alpha C_2)}{\alpha} \cdot s}{s(1+sC_2R_2)}$$

By multiplying the transfer function of the additional filter at the subsequent stage, the transfer function F(s) of the entire active filter is given by the following equation.

$$F(s) = \frac{V_C}{I_1} \cdot \frac{1}{1+sC_3R_3}$$

$$= \frac{\alpha}{C_1} \cdot \frac{1 + \frac{R_2(C_1 + \alpha C_2)}{\alpha} \cdot s}{s(1+sC_2R_2)(1+sC_3R_3)}$$

$$= \frac{\alpha}{C_1} \cdot \frac{1+sT_2}{s(1+sT_1)(1+sT_3)}$$

wherein $T_1 = C_2 R_2$, $T_2 = \frac{R_2(C_1+\alpha C_2)}{\alpha}$, $T_3 = C_3 R_3$ The transfer function F(s) is compared with the transfer function of the passive filter shown in FIG. 1. As described above, the portion of the additional filter is the same, and the transfer function of the preceding portion (a parallel circuit of $C_1$ and $R_2$—$C_2$ which is a series circuit) is given below.

$$\frac{1}{C_1+C_2} \cdot \frac{1+sC_2R_2}{s\left(1+s \cdot \frac{R_2 C_1 C_2}{C_1+C_2}\right)}$$

$$T'_1 = \frac{R_2 C_1 C_2}{C_1+C_2}, \quad T'_2 = C_2 R_2$$

Thus, the transfer function obtained when an additional filter is added, has a different value for a constant, but is the same in format as F(s). Therefore, the active filter according to the present invention has similar functions and effects as a filter as compared with the passive filter shown in FIG. 1.

Figure 7:
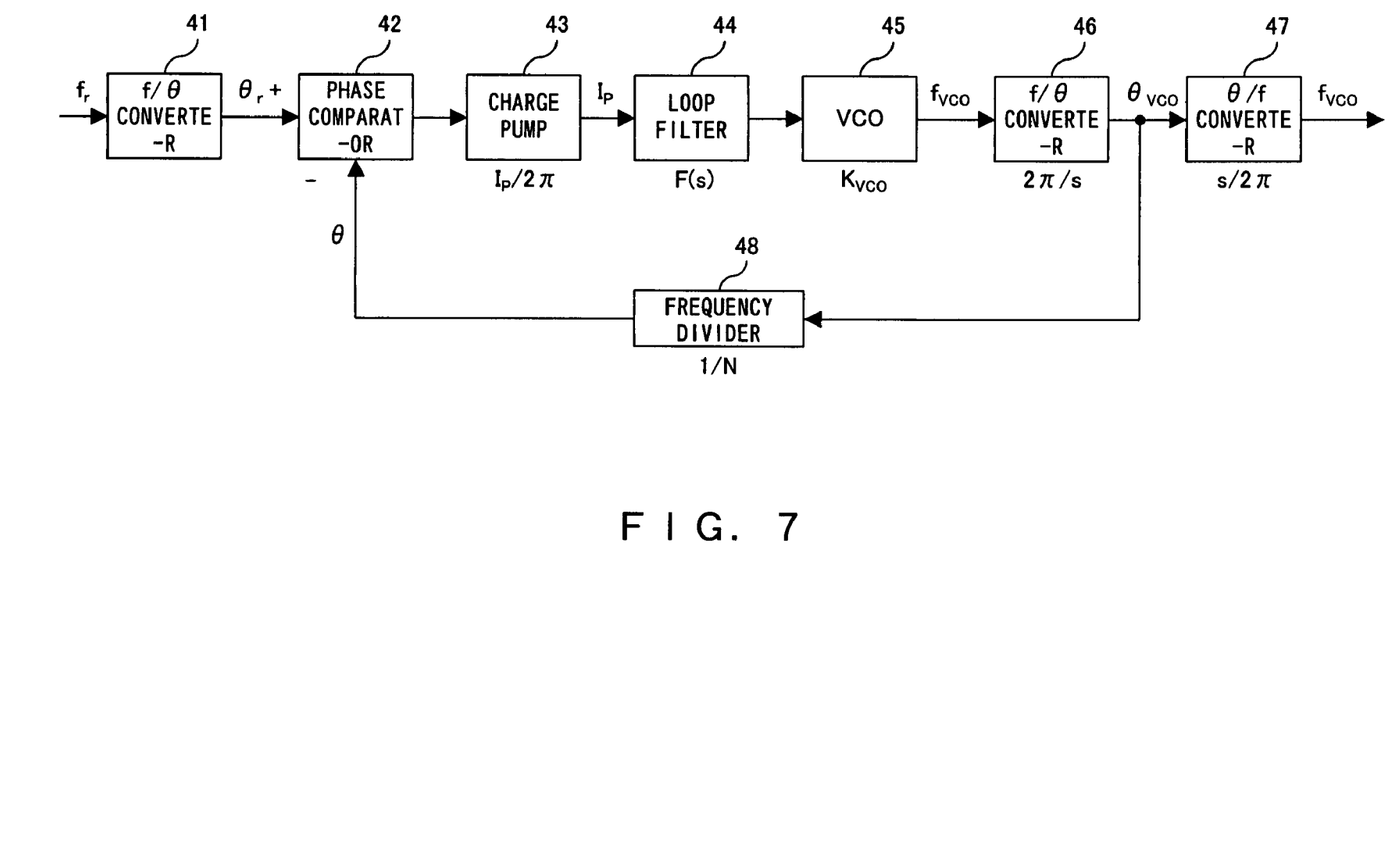
FIG. 7 is an explanatory view of an example of the configuration for calculating an open loop transfer function of a PLL circuit.

To calculate the value of the electrostatic capacity $C_1$ with the transfer function F(s) of the active filter associated with the open loop transfer function of the entire PLL circuit, the open loop transfer function G(s) of the PLL circuit is obtained using the detailed configuration of the PLL circuit shown in FIG. 7.

In FIG. 7, to compare the phase after converting the frequency to phase angle, two f/θ converters 41 and 46 are used, each of the reference frequency fr and the frequency fvco of a signal output from a VCO 45 is converted to a phase angle θ, frequency-divided by a frequency divider 48 as necessary, and compared by a phase comparator 42. In FIG. 7, the signal of the frequency of N times $f_r$, in the locked status of the PLL shown in FIG. 7, is output from the VCO 45. The relation of f and θ is given as follows.

$$\theta = \int \omega \cdot dt = 2\pi \int f \cdot dt = \frac{2\pi}{s} \cdot f, \text{ where } \omega = 2\pi f$$

The loop filter 44 shown in FIG. 7 corresponds to the active filter according to the present invention, and the transfer function of the loop filter 44 is F(s) below the block, the transfer function of a charge pump 43 is Ip/2π, and the transfer function of the VCO 45 is Kvco.

As a result, the open loop transfer function G(s) as a product of the transfer functions of each block of the charge pump 43, the loop filter 44, the VCO 45, the f/θ converter 46, and the frequency divider 48 is obtained by the following equation.

$$G(s) = \frac{K_{VCO}I_P}{sN} \cdot F(s)$$

By substituting the equation of F(s), G(s) is obtained by the following equation.

$$G(s) = \frac{\alpha K_{VCO}I_P}{NC_1} \cdot \frac{1+sT_2}{s^2(1+sT_1)(1+sT_3)}$$

The value of the electrostatic capacity $C_1$ is determined by the loop band angular frequency ωp (where ω=2πf) with the absolute value "1" of the gain of the open loop transfer function G(s), as shown below.

$|G(j\omega)|=1$, where $\omega=2\pi f$

Figure 8:
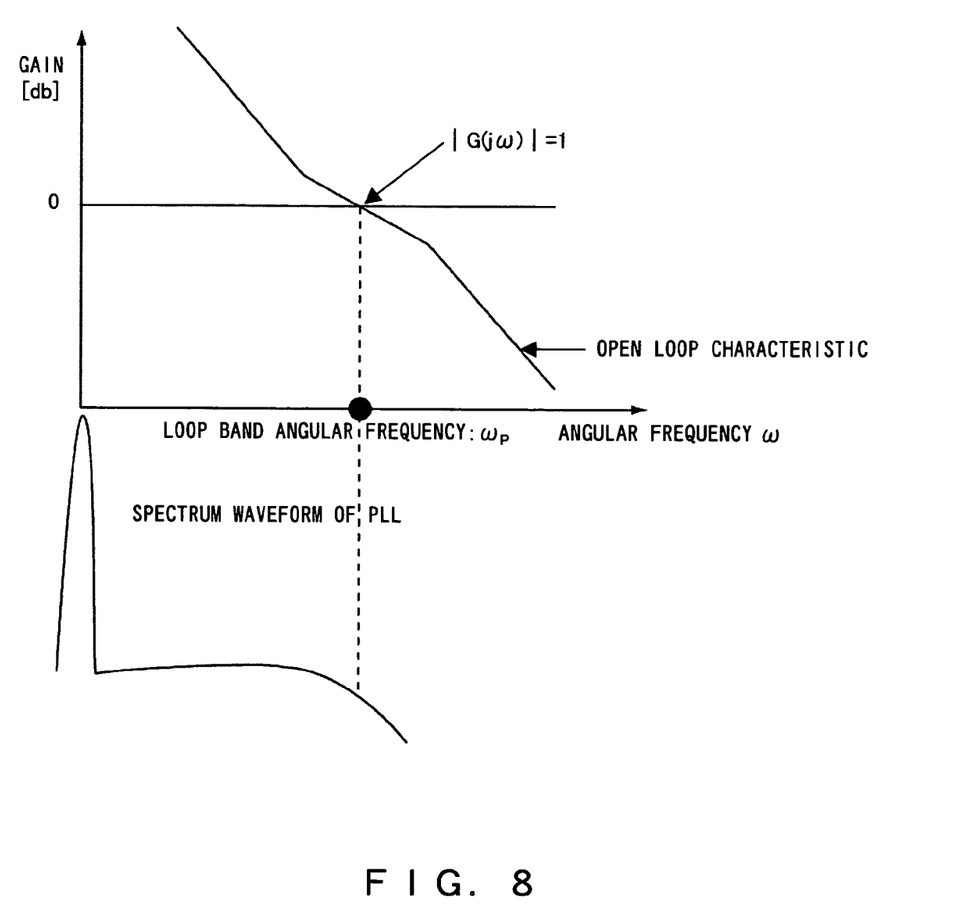
FIG. 8 is an explanatory view of a loop band angular frequency.

FIG. 8 is an explanatory view of the loop band angular frequency ωp. Generally, when the noise characteristic of a PLL circuit is measured, the spectrum waveform shown in FIG. 8 is measured by a spectrum analyzer, etc., the loop band angular frequency ωp is determined as an angular frequency having $|G(j\omega)|$ of "1", that is, 0 dB as a gain, where the spectrum waveform suddenly drops.

Therefore, the electrostatic capacity $C_1$ is obtained by the following equation using the loop band angular frequency ωp.

$$C_1 = \frac{\alpha I_P K_{VCO}}{N\omega_P^2} \sqrt{\frac{(1+\omega_P^2 T_2^2)}{(1+\omega_P^2 T_1^2)(1+\omega_P^2 T_3^2)}}$$

In the equation of the electrostatic capacity $C_1$ 30, α is contained in the numerator. By changing the value of α, the value of the electrostatic capacity $C_1$ can be variable. The values of the resistance $R_2$ 24 and the electrostatic capacity $C_2$ 25 at the input of the voltage adder 32 can be calculated by the following equation using the time constants $T_1$ and $T_2$.

$R_2=\alpha(T_2-T_1)/C_1$, $C_2=T_1/R_2$

The values of the resistance $R_3$ 33 and the electrostatic capacity $C_3$ 34 forming an additional filter can be similarly calculated as in the conventional technology shown in FIG. 1, but these values are not directly related to the present invention. Therefore, the explanation is omitted here.

Figure 9:
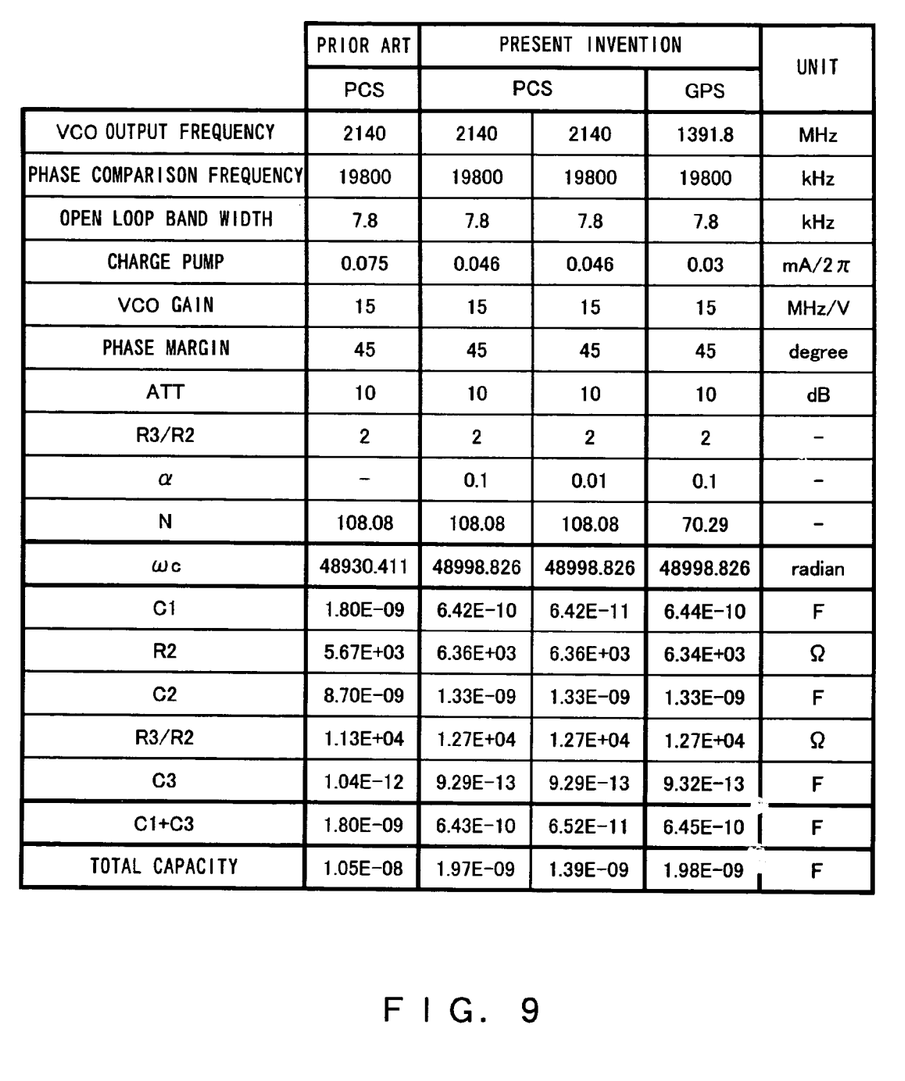
FIG. 9 shows a result of the comparison of the circuit constants between the active filter according to the present invention and the passive filter of a conventional technology.

FIG. 9 shows a result of the comparison between the active filter according to the present invention and the passive filter of a conventional technology shown in FIG. 1. The value indicating the total electrostatic capacity in the filter is about ⅕ of the value of the conventional technology in the PCS (personal communication system) band and the GPS (global positioning system) band by using "0.1" as, for example, a value of α. Furthermore, in the PCS band, by changing the value of α from "0.1" to "0.01", the value of the electrostatic capacity $C_1$ can be reduced by one digit.

The value of ATT shown in FIG. 9 shows the effect of the additional filter, and refers to a parameter referred to as an attenuate indicating how much the value of the gain in the frequency of a reference signal is reduced from the gain value in the frequency at which the asymptotic gain characteristic of the open loop transfer function folds itself corresponding to a time constant determined by $R_3$ and $C_3$ forming the additional filter. The parameter is also not directly related to the characteristic of the active filter according to the present invention. Therefore, the detailed explanation is omitted here.

Figure 10:
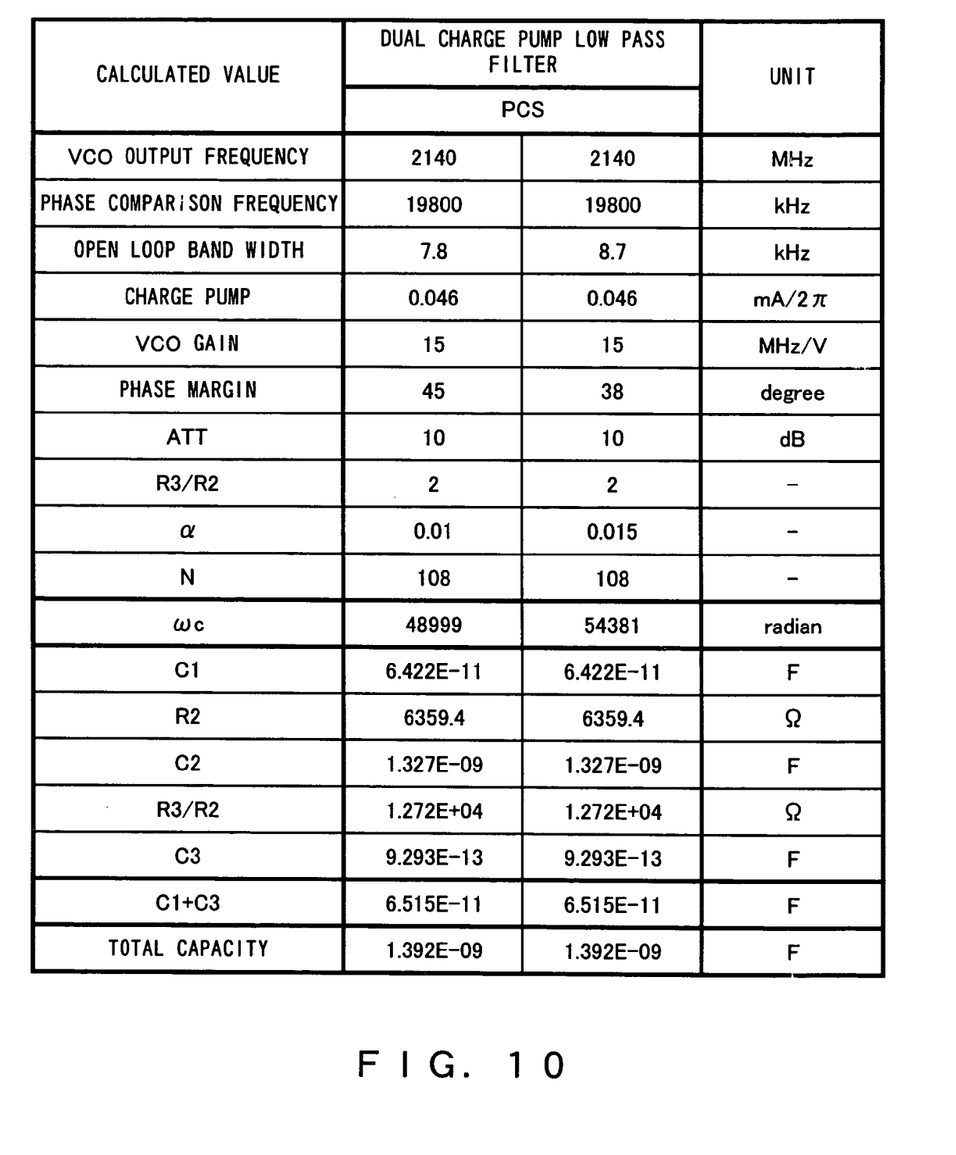
FIG. 10 shows a result of the comparison of the characteristics of filters when the current ratio of two charge pump circuits is changed.

FIG. 10 shows a result of the comparison of the characteristics of active filters when the value of α is changed with the value of the circuit constant fixed in the active filter according to the present invention. By changing the value of α from "0.01" to "0.015", an important parameter as the characteristic of a filter, for example, the open loop band width (a smaller value reduces the noise, and a larger value speeds up the lockup) can be changed from 7.8 to 8.7 kHz, and the phase margin can be changed from 45° to 38°. Thus, by changing a little bit the value of a with the constant of the circuit element forming the filter fixed, fine adjustments can be made on the characteristic of the filter, thereby amending the variance of a process and fitting a filter for different applications.

What is claimed is:

1. An active filter receiving output from a first charge pump circuit and a second charge pump circuit, comprising:
   a first circuit component connected between output of the first charge pump circuit and a ground;
   a second circuit component connected between output of the second charge pump circuit and the ground;
   a voltage addition unit adding up voltage between both ends of the first circuit component and voltage between both ends of the second circuit component,
   an additional filter at a subsequent stage of the active filter, and the additional filter comprises:
   resistance, one terminal of which is connected to an output of the voltage addition unit;
   a capacity connected between another terminal of the resistance and the ground, wherein:
   the additional filter uses voltage between both ends of the capacity as output voltage; and
   a selector circuit selecting said second charge pump circuit from two charge pump circuits each of which has a different current ratio of output current relative to current from the first charge pump circuit, the active filter receives output from the first charge pump circuit and the second charge pump circuit.

2. The active filter according to claim 1, wherein
   the active filter further comprises either a parallel connection of a resistance and a capacitor connected between an output of a charge pump circuit coupled thereto and ground, or a capacitor connected between a charge pump circuit coupled to thereto and ground.

3. The active filter according to claim 1, wherein
   each of the first charge pump circuit and the second charge pump circuit is coupled to a phase comparator and each of the first charge pump circuit and the second charge pump circuit outputs a current different from each other, wherein
   the first charge pump circuit and the second charge pump circuit each provides an output to the active filter coupled thereto on the basis of a period corresponding to a result of the phase comparator connected to the first charge pump circuit and the second charge pump circuit.

4. A semiconductor integrated circuit comprising the active filter according to claim 1, and another circuit which are formed on a single chip.

\* \* \* \* \*